United States Patent
Daubenspeck et al.

(10) Patent No.: US 7,635,643 B2
(45) Date of Patent: Dec. 22, 2009

(54) METHOD FOR FORMING C4 CONNECTIONS ON INTEGRATED CIRCUIT CHIPS AND THE RESULTING DEVICES

(75) Inventors: Timothy H. Daubenspeck, Colchester, VT (US); Mukta G. Farooq, Hopewell Junction, NY (US); Jeffrey P. Gambino, Westford, VT (US); Christopher D. Muzzy, Burlington, VT (US); Kevin S. Petrarca, Newburgh, NY (US); Wolfgang Sauter, Richmond, VT (US)

(73) Assignee: International Business Machines Corporation, Armonk, NY (US)

( * ) Notice: Subject to any disclaimer, the term of this patent is extended or adjusted under 35 U.S.C. 154(b) by 249 days.

(21) Appl. No.: 11/380,215

(22) Filed: Apr. 26, 2006

(65) Prior Publication Data

US 2007/0252274 A1 Nov. 1, 2007

(51) Int. Cl.
H01L 21/44 (2006.01)
H01L 23/48 (2006.01)
H01L 23/52 (2006.01)
H01L 29/40 (2006.01)

(52) U.S. Cl. ........................ 438/613; 438/611; 438/612; 257/738

(58) Field of Classification Search ................. 257/738, 257/751, 758–760; 438/611–614
See application file for complete search history.

(56) References Cited

U.S. PATENT DOCUMENTS

| 6,426,557 B1 * | 7/2002 | Daubenspeck et al. ...... 257/750 |
| 2001/0013423 A1 | 8/2001 | Dalal et al. |
| 2003/0215984 A1 | 11/2003 | Pogge et al. |
| 2005/0012111 A1 | 1/2005 | Howard et al. |
| 2005/0104208 A1 | 5/2005 | Bartelo et al. |
| 2005/0158980 A1 | 7/2005 | Seshan |
| 2005/0191836 A1 * | 9/2005 | Tzeng et al. ................. 438/612 |
| 2005/0224966 A1 | 10/2005 | Fogel et al. |
| 2005/0258540 A1 * | 11/2005 | Minda ......................... 257/738 |

* cited by examiner

*Primary Examiner*—Ha Tran T Nguyen
*Assistant Examiner*—Valerie Brown
(74) *Attorney, Agent, or Firm*—Edward W. Brown; William D. Sabo

(57) ABSTRACT

A method for forming preferably Pb-lead C4 connections or capture pads with ball limiting metallization on an integrated circuit chip by using a damascene process and preferably Cu metallization in the chip and in the ball limiting metallization for compatibility. In two one embodiment, the capture pad is formed in the top insulating layer and it also serves as the final level of metallization in the chip.

20 Claims, 8 Drawing Sheets

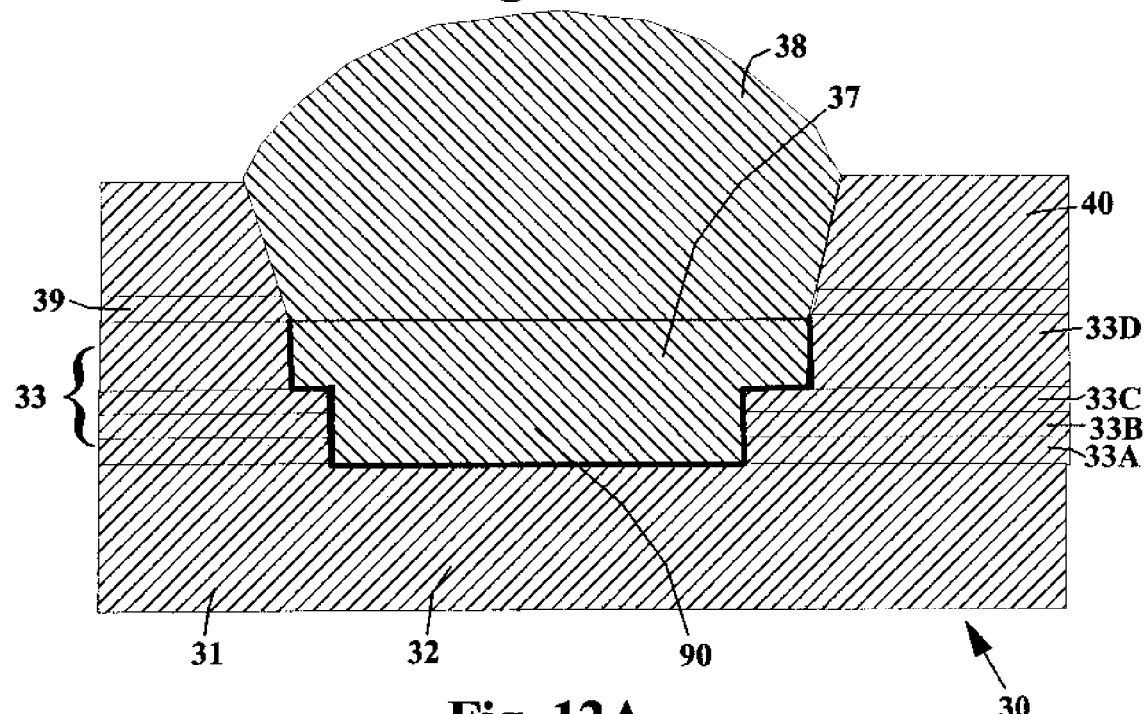
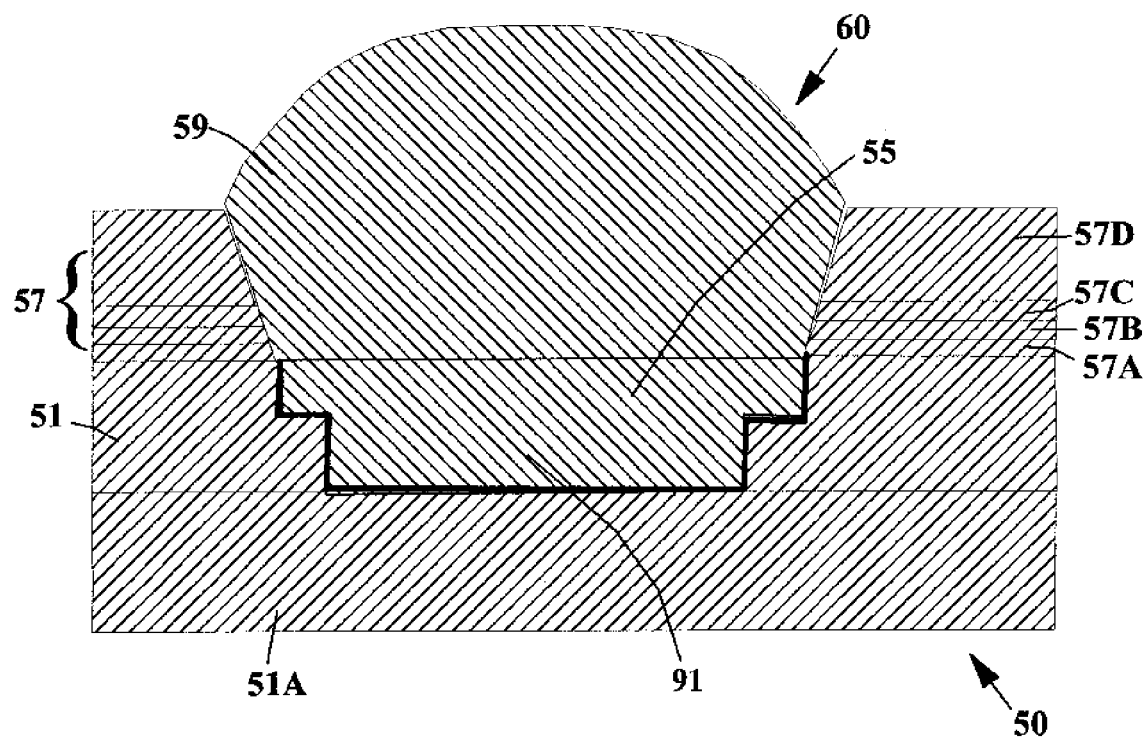

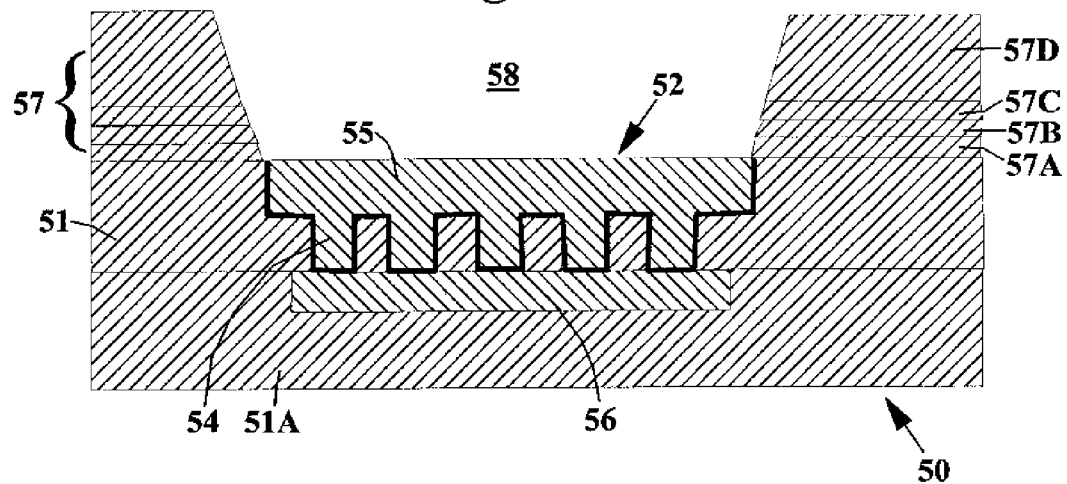
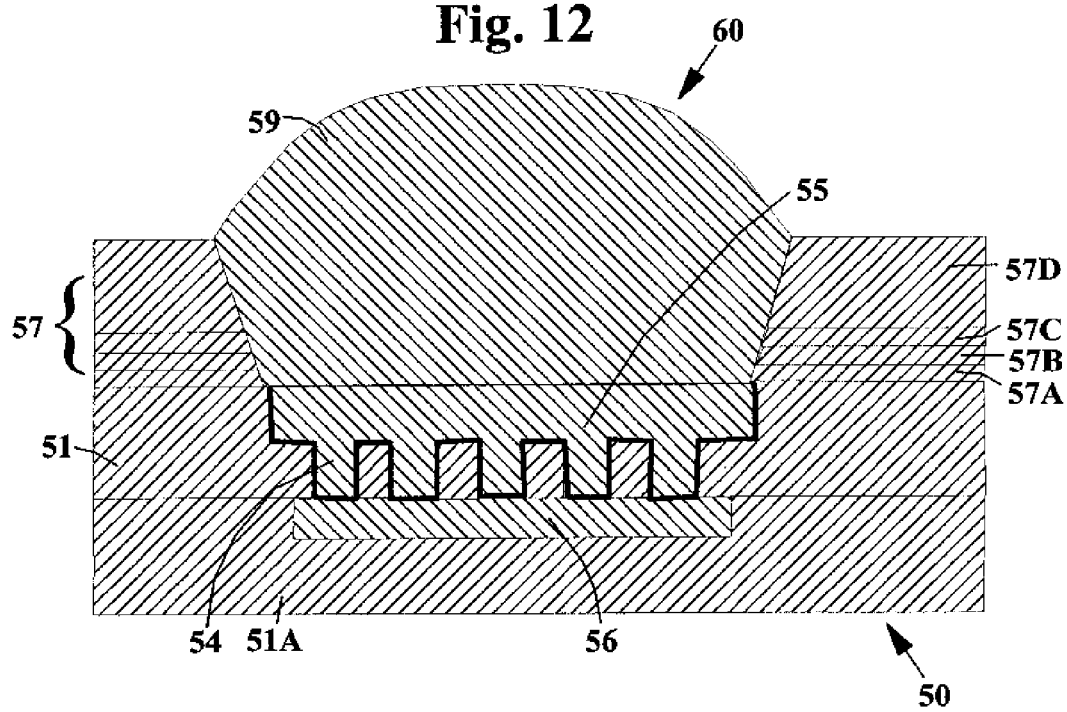

METHOD FOR FORMING C4 CONNECTIONS ON INTEGRATED CIRCUIT CHIPS AND THE RESULTING DEVICES

FIELD OF INVENTION

This invention relates to the interconnection of microelectronic circuit chips to a chip carrier substrate and, in particular, area-array flip-chip interconnection technology known as C4 (Controlled Collapse Chip Connection).

BACKGROUND OF THE INVENTION

Area-array flip-chip interconnection or C4 technique places a solder bump area array on the top of a fabricated microelectronic circuit chip or integrated circuit chip and the chip is connected via the solder bumps to a chip carrier substrate by flipping the chip up-side-down and aligning it to pads on the carrier followed by reflowing the solder to connect the bumps. This face-down placement of the chip on the carrier is the reason it is called flip-chip joining. The advantages of the C4 technique are: 1) the entire area of the chip can be covered with solder bumps for the highest possible number of input/output points on a chip; 2) the interconnect distances to the circuit on the chip are shorter thereby permitting faster signal response and lower inductance; 3) power and heat distribution are more uniform; and 4) simultaneous switching noise is reduced.

The solder bumps are deposited on a patterned solder-wettable layered structure known as BLM (Ball Limiting Metallurgy). The BLM defines the terminal metal pads on the top surface of the chip which is wettable by solder and which also limits the lateral flow of the solder to the pad area. After the solder bumps are reflowed on the patterned BLM to form balls, the chips are joined to a matching footprint of solder-wettable layers on the chip carrier. The BLM is generally a multilayer structure comprising a lower adhesion layer, a middle reaction barrier layer, and a wettable upper layer. The lower layer provides adhesion to the underlying substrate. This layer also can serve as a diffusion/reaction barrier layer to prevent interaction of the silicon wafer and its wiring layers. This layer is thin, on the order of hundreds to thousands angstroms, and usually deposited by sputtering or evaporation on the wafer passivation, which is a polymer, such as polyimide, or an oxide or a nitride. Examples of materials for the adhesion layer are Cr, TiW, Ta, W, Ti, TiN, TaN, Zr or a combination of these materials.

The middle layer of the BLM is a reaction barrier layer which is solderable by molten solder but reacts slowly to allow for multiple reflow cycles without being totally consumed. The material of this layer is Cr, CrCu, Cu, Al, Ni, or any metal containing one or more of these material and is usually on the order of thousands of angstroms to microns in thickness after be deposited by physical vapor deposition (PVD), sputtering or evaporation.

The upper layer of the BLM is the solder wettable which allows easy solder wetability and a fast reaction with the solder. Copper (Cu) is an example of the material normally used and its thickness is of the order of a few hundreds to thousands of angstroms and, in some cases, up to microns after being deposited by sputtering, electroless- or electro-plating.

To fabricate the solder bumps on top of the BLM structure, a number of techniques are known in the art, such as evaporation, plating, stencil printing, paste screening, and molten solder injection. A present method of forming the C4 solder bumps is to electroplate solder through a thick (100 um) dry resist film mask onto the BLM structure. Following a resist strip, a wet etch is used to pattern the BLM, using the plated solder bumps as the mask. This is described in a paper entitled "Low-cost wafer bumping", IBM J. Res. & Dev., Vol. 49, No. 4/5, July/September 2005 and which also describes Injection-Molded Solder (IMS), the preferred method in the present specification of depositing solder to the BLM structure or capture pads on the chips in the wafer. This "Low-cost wafer bumping" paper is incorporated by reference.

One of the problems with the present C4 solder bumps is that the solder contains lead (Pb) which is not desirable from an environmental standpoint. To use Pb-free solder requires a thicker copper (Cu) layer because the solder is comprised solely of tin (Sn) and will diffuse into the chip with a thin Cu layer. A significant problem with this process involves dimensional control of the final placement of the edges of the BLM layer, which tends to undercut the top layer of Cu by as much as 10 microns per edge due to wet etching, reducing the adhesive cross-section of the C4 structure and creating a reliability risk. Another problem with the present C4 solder bump method is that a terminal aluminum (Al) on top of the chip serves as a landing pad for the BLM/C4 structure to increase reliability in pull testing of the structure. The Al pad is expensive to fabricate and is incompatible with the copper (Cu) metallization of the chip.

SUMMARY OF THE INVENTION

Therefore, it is a primary object of the present invention to provide an improved structure for the BLM/C4 without employing an Al pad and without decreasing the integrity and reliability of the bond between the BLM and the C4 solder bump.

Another object of the present invention to provide an improved BLM/C4 structure with the solder of the C4 being free of Pb.

A further object of the present invention is to provide an improved BLM/C4 structure such that the BLM structure is contained within the chip and serves as a capture pad for the C4.

Additional object of the present invention is to provide and improved BLM/C4 structure which is compatible with the metallization of the chip and does not require wet etching.

In two embodiments of the BLM/C4 structure, it is an object of the present invention to provide the BLM such that it also serves as the final metallization of the chip.

The foregoing and other objects are achieved by forming the BLM as a capture pad in or below the passivation layer and extending to or being coextensive with the final level of chip metallization with no intervening Al layer and without wet etching. The capture pad is formed by creating cavities, using the damascene technique, in or below the passivation layer and filling the cavities with the BLM. In more detail as to one embodiment, the passivation layer on the chip is etched, preferably by isotropic etching in a fluorine plasma, after being deposited, through a resist mask to create a lower smaller cavity in the passivation layer and an upper larger cavity by the dual damascene technique. In this one embodiment, the lower cavity is a trench which serves as a via and extends to the final metallization layer in the chip. The BLM is deposited in the cavities to form at least one via and a capture pad for the C4 bump. In another embodiment, the capture pad is formed in the final insulation layer of the chip and serves the dual function of a capture pad and the final level of metallization for the chip. In this other embodiment, the lower cavity can be in the form of a trench and serve as a via to the second to last chip metallization and can be formed by either a dual or single damascene technique.

BRIEF DESCRIPTION OF THE DRAWINGS

The foregoing and other objects, aspects and advantages will be better understood from the following detailed description of preferred embodiments of the invention with reference in the drawings, in which:

FIG. 11 is a cross-sectional view of a third embodiment of the present invention in which the capture pad is being formed in the chip and also serves as the final level of metallization with trenches or vias to the second to last metallization in the chip.

FIG. 12 is a cross-sectional view of the third embodiment of the present invention including the structure of FIG. 11 and showing, in addition, reflowed solder disposed in the via of FIG. 1.

FIG. 10A is a cross-section view of the present invention and is a modification of FIG. 10 by replacing the trenches in the lower cavity with a continuous layer of BLM materials.

FIG. 12A is a cross-section view of the present invention and is a modification of FIG. 12 by replacing the trenches in the lower cavity with a continuous layer of BLM materials.

DETAILED DESCRIPTION OF THE PREFERRED EMBODIMENTS OF THE INVENTION

Figure 1:
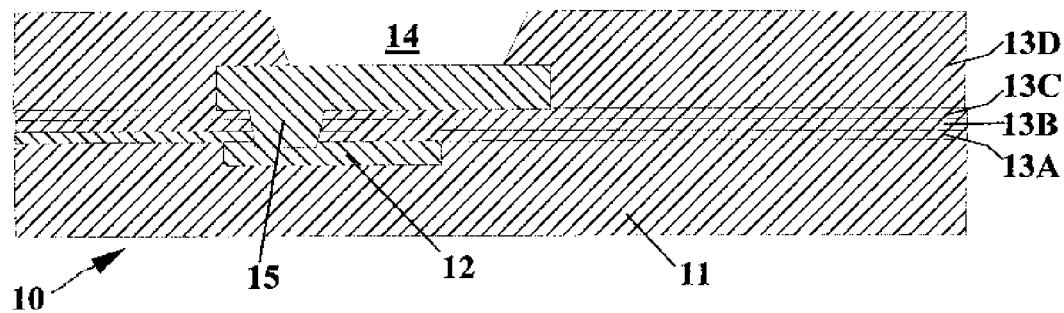
FIG. 1 PRIOR ART is a cross-sectional view showing a portion of an integrated circuit chip with a final metal layer in the chip and a multiple of passivation layers with an aluminum metal layer disposed in the passivation layers and above but connecting the final metal layer through a via, the upper passivation layer being formed with an open via reaching to the aluminum metal layer.

To be able to better understand the present invention and the embodiments encompassing the invention, the PRIOR ART as shown in FIGS. 1-4 will first be described. FIG. 1 PRIOR ART shows the upper portion of a chip 10 from a wafer (not shown). The chip 10 comprises a top insulating layer 11, herein silicon oxide, containing a final level or layer of Cu metallization 12. Deposited on the insulating layer 11 and Cu layer are passivation layers 13A, 13B, 13C and 13D. The layers 13A, 13B, and 13C are formed with a via 14. An Al (Aluminum) pad 15 is contained in the passivation layers 13A-13D and extends to the Cu layer 12 through the via 14. Another large via 16 is formed in the upper portion of the passivation layer 13D and extends to the Al layer. Herein, the passivation layers 13A-13D are silicon nitride, silicon oxide, silicon nitride and polyimide, respectively.

Figure 2:
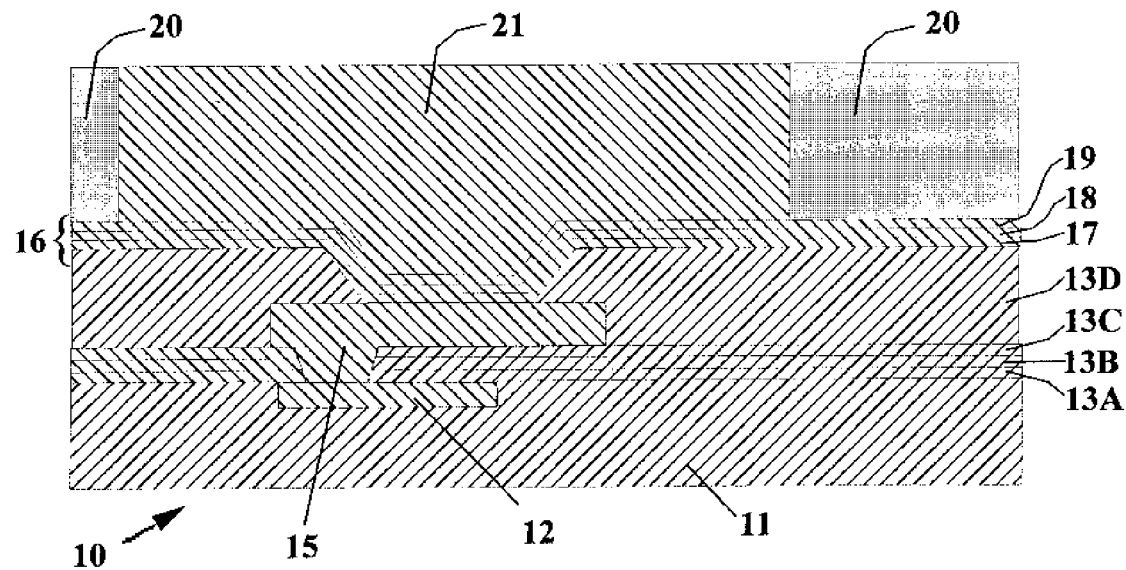
FIG. 2 PRIOR ART is a cross-sectional view including the portion of the integrated circuit chip of FIG. 1 and showing, in addition, BLM layers on the passivation layer and a developed resist pattern on the BLM and outlining an area over the final metal and aluminum metal and being filled with solder.

As shown in FIG. 2 PRIOR ART, BLM (Ball Limiting Metallization) is formed in three layers, consisting of a bottom adhesive layer 17 of, for example, TiW. Other materials for the adhesion layer are Cr, Ta, W, Ti, TiN, TaN, Zr or a combination of these materials. The middle layer 18 is a reaction barrier layer which is solderable by molten solder but reacts slowly to allow for multiple reflow cycles without being totally consumed. The material of this layer is Cr, CrCu, Cu, Al, Ni, or any metal containing one or more of these material and is usually on the order of thousands of angstroms to microns in thickness after be deposited by physical vapor deposition (PVD), sputtering or evaporation. The upper layer 19 of the BLM is the solder wettable which allows easy solder wetability and a fast reaction with solder. Chromium (Cr) Copper (Cu) is an example of the material normally used and its thickness is of the order of a few hundreds to thousands of angstroms and, in some cases, up to microns after being deposited by electroplating. The BLM layers conform to the surface of the via 16 and the adhesive layer 13A contacts the Al pad 15. A resist is patterned on the BLM layer 19 to create an opening (not shown) aligned with the Al pad 15 and the final Cu metallization 12. Solder 20, herein PbSn, is electroplated in the opening.

Figure 3:
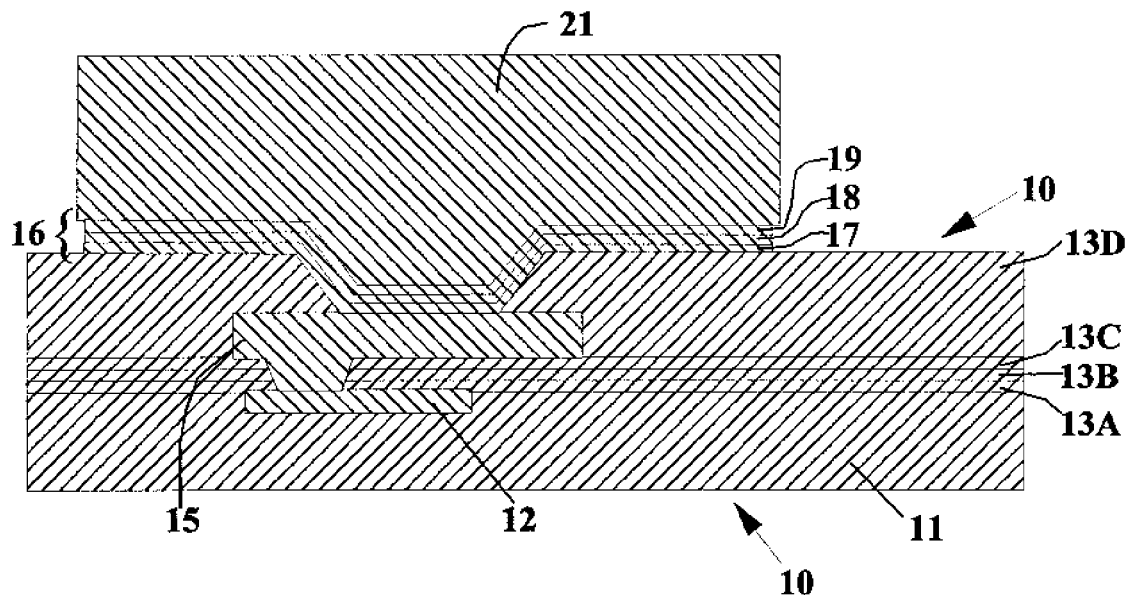
FIG. 3 PRIOR ART is a cross-sectional view including a portion of the integrated circuit chip of FIG. 2 and showing, in addition, the removal or stripping of the resist and the BLM underlying the resist by wet etching.
Figure 4:
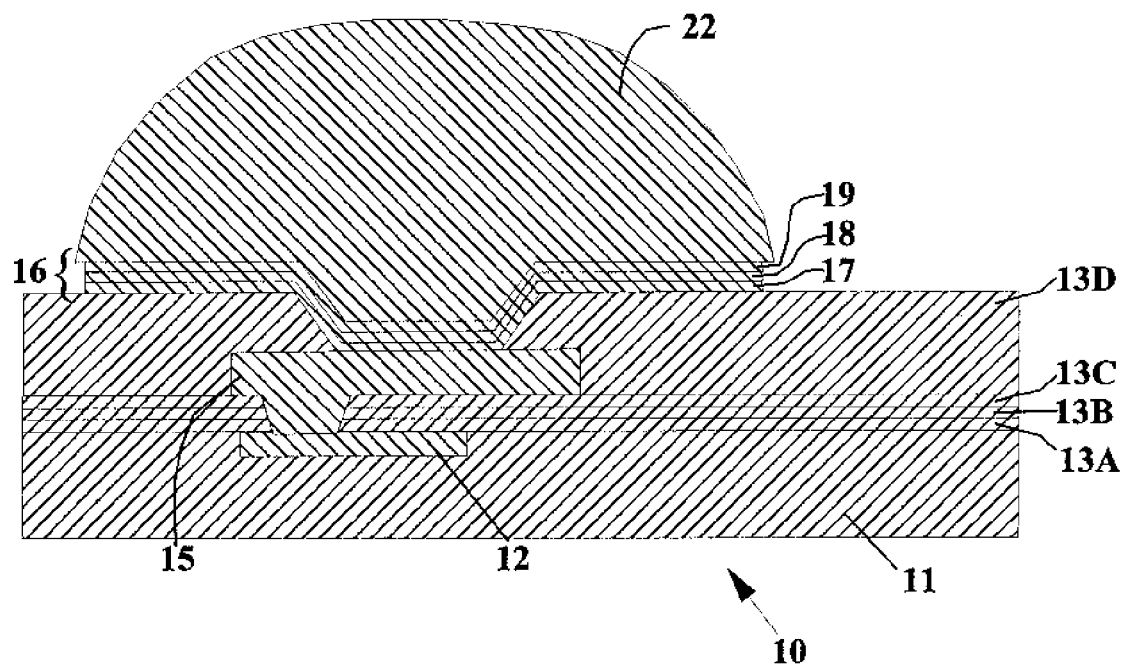
FIG. 4 PRIOR ART is a cross-sectional view including a portion of the integrated circuit chip of FIG. 3 and showing, in addition, the solder reflowed to a solder bump structure.

Turning to FIG. 3 PRIOR ART, there is shown the resist 20 stripped or removed by ashing and the layer 17 of TiW is wet etched or electroetched to the polyimide passivation layer 13D. As shown in t FIG. 3 PRIOR ART and FIG. 4 PRIOR ART, a disadvantage of the prior art process is that in removing the BLM 16, there is about a 10 micron undercut under the deposited solder 20. The BLM is removed by wet etching and is undercut as shown under the solder 20 and the solder bump 21, respectively. This undercutting affects the reliability of the bond between the BLM 16 and the solder bump 21. In FIG. 4 PRIOR ART, the solder has been reflowed to form the C4 bump 21.

Figure 5:
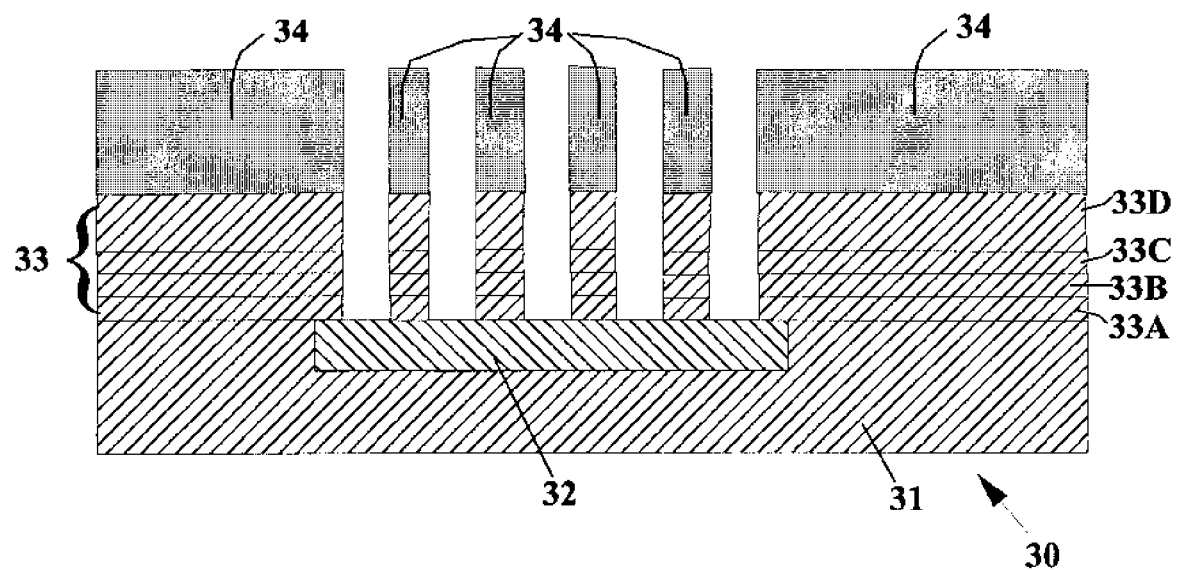
FIG. 5 is cross-sectional view of the preferred embodiment of the present invention showing a portion of an integrated circuit chip with the final metal layer in the chip covered with passivation layers and a developed resist pattern creating, by a damascene process, trenches in the passivation layers to form pillars to the final metal layer.
Figure 6:
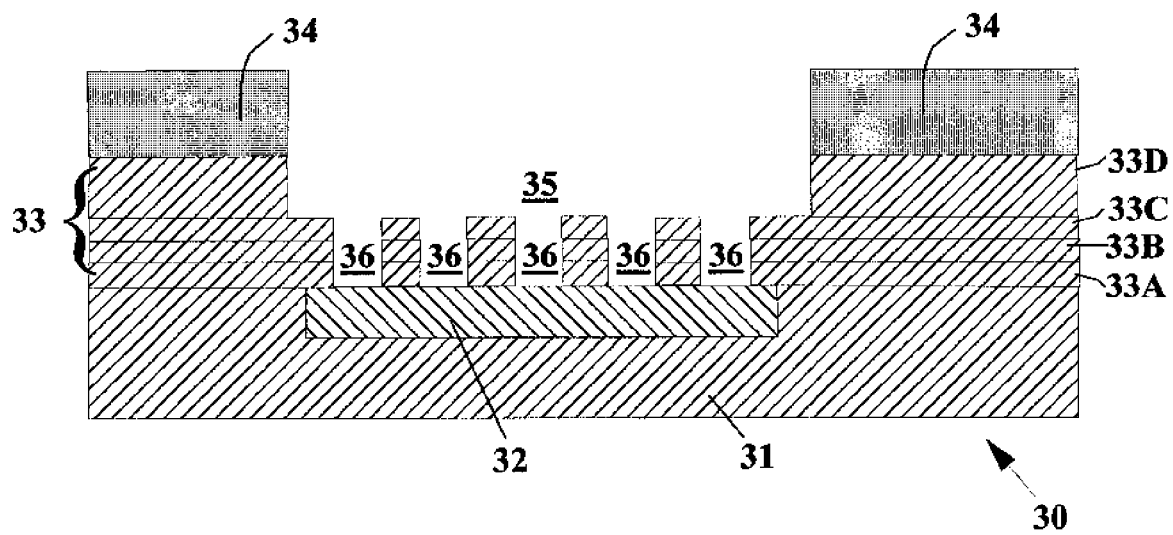
FIG. 6 is a cross-sectional view of the preferred embodiment of the present invention including the lower structure of FIG. 5 and showing, in addition, the removal of the upper passivating layer on the pillars and at the edges of the outer trenches to create, by the damascene process, a cavity above the trenches.

Now, in accordance with the preferred embodiment of the present invention, FIG. 5 shows the upper portion of a chip 30 from a wafer (not shown) with an insulating layer 31, herein silicon oxide and a final level of metallization 32, herein Cu (copper). On the upper surface of the insulating layer 31 and final metallization 32 is passivation layer, 33 herein, four layers, 33A, 33B, 33C, and 33D which are SiN, $SiO_2$, SiN, and a thickness. Using a patterned resist mask 34 and the dual damascene process, the passivation layers 33A-33D are isotropically etched using a fluorine based plasma to yield the structure shown in FIG. 6 in which, due to uniform etching in all directions by the isotropic etchant, the resist 34 and the underlying thick passivation layer 33D, due to their thickness, etch laterally essentially in the same amount as they do vertically whereby the passivation layer 33D is completely etched to create a cavity 35. A series of trenches 36 are formed in the thinner passivation layers 33A-33C, extending to the metallization level 32, herein copper (Cu). Alternatively, the passivation layers 33A-33D can be anisotropically etched to form a continuous lower cavity 90 instead of trenches 36, as shown in FIG. 10A.

Figure 7:
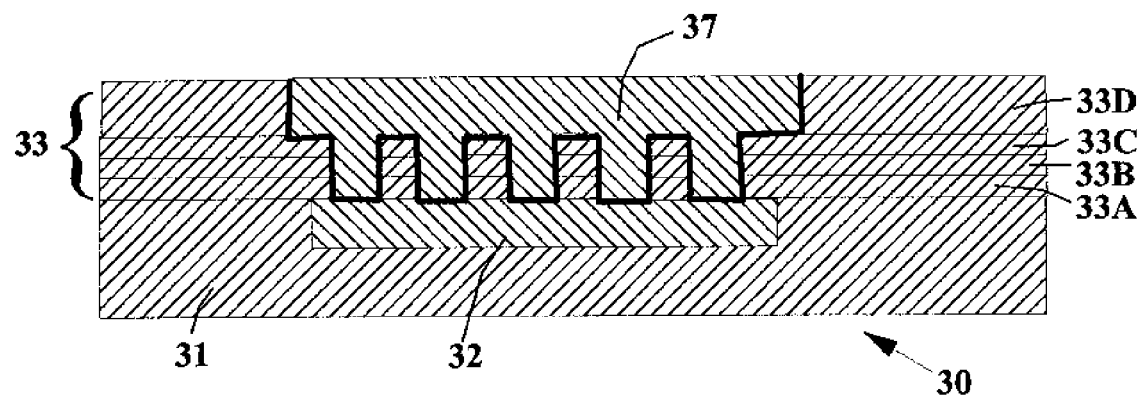
FIG. 7 is a cross-sectional view of the preferred embodiment of the present invention including the structure of FIG. 6 with the resist removed and showing, in addition, the trenches and cavity being filled, by the dual damascene process, with BLM materials and the upper surface of the BLM or capture pad planarized level with the surface of the upper passivating layer.
Figure 8:
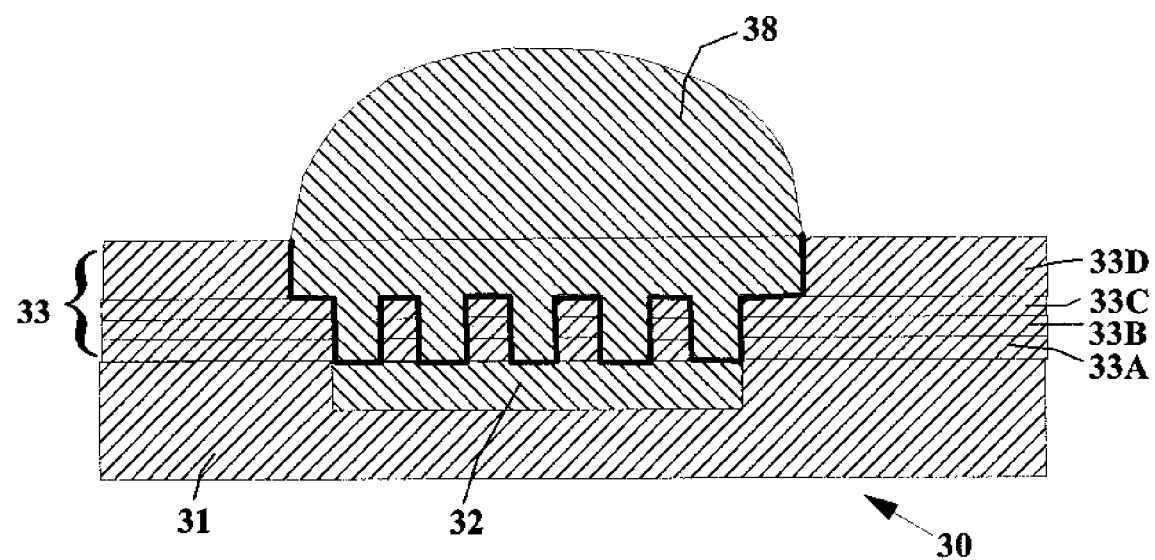
FIG. 8 is a cross-sectional view of the preferred embodiment of the present invention including the structure of FIG. 7 and showing, in addition, solder disposed on the capture and reflowed to form a solder bump.

A capture pad 37 comprised of deposited BLM materials is shown in FIG. 7 and, herein by way of example, the materials from bottom to top in the capture pad 37 are about 50 nm of TaN, about 150 nm of TiW, about 400 nm of Ti, and about 500 nm of Cu. The Cu is relatively thick and serves as a barrier for Sn diffusion into the chip and can be modified for thickness and composition for this purpose. This damascene process eliminates wet etching and the resulting undercut, thereby dimensional control and reliability are no longer a problem. The upper surface of the capture pad 37 and the co-extensive passivation layer 33D are planarized, in the present instance, by chemical/mechanical polishing followed by depositing a solder metal, preferably Pb-free from a glass substrate (not shown) by a transfer process, to the capture pad 37 and reflowing the solder metal to a C4 bump 38 as shown in FIG. 8. The transfer process is described in detail in the paper, "Low cost wafer bumping", which is incorporated by reference in the BACKGROUND section of the specification.

Figure 9:
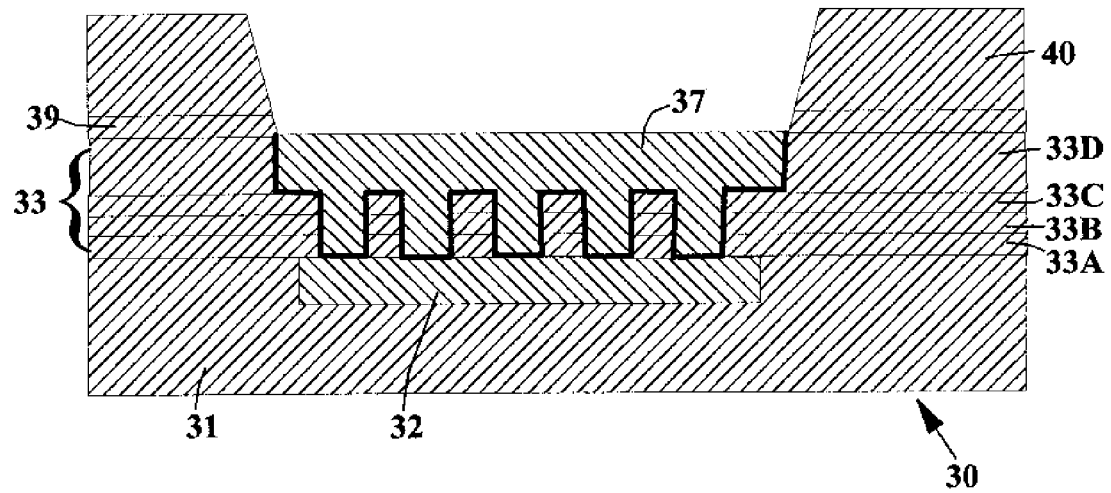
FIG. 9 is a cross-sectional view of second embodiment of the present invention including the capture portion of FIG. 7 and showing, in addition, a thin insulating layer covered by a passivation layer on the surface of the capture pad and adjacent insulating layer, both being patterned to create an open via to the BLM.
Figure 10:
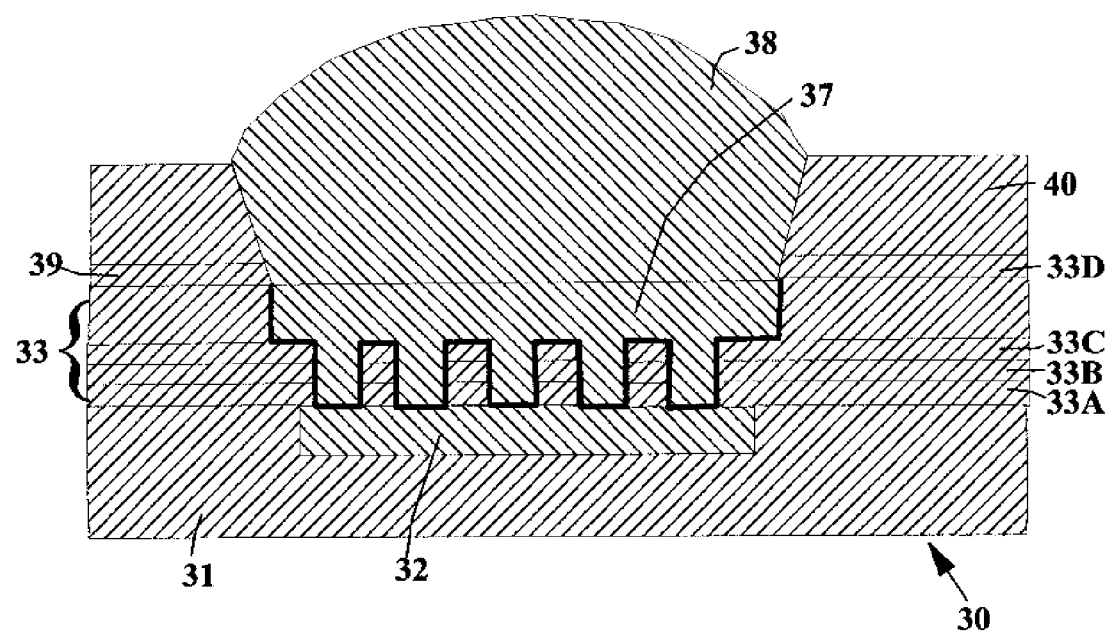
FIG. 10 is a cross-sectional view of the second embodiment of the present invention including the structure of FIG. 9 and showing, in addition, reflowed solder disposed in the via of FIG. 9.

As a modification of the preferred embodiment of the present invention of FIGS. 5-8, a thin passivation layer 39, herein SiN, is deposited on the thick passivation layer 33D along with a thicker passivation layer 40, herein polyimide, before the preferred Pb-free solder metal is transferred to the capture pad 37, as shown in FIG. 9. After the formation of these passivation layers 39 and 40, the solder metal is transferred to the capture pad 37 and reflowed to form the C4 bump 38 as shown in FIG. 10.

In accordance with another embodiment of the present invention, the chip 50 is fabricated with its top insulating layer 51 containing a capture pad 52 in FIG. 11. The capture pad 52 also will serve as the final metallization level or layer in addition to its capture pad function. Using the dual damascene process in which the insulating layer 51 is first deposited, trenches 54 are formed, by anisotropic or directional etching through a resist mask (not shown), in the chip insulating layer 51 along with an upper cavity 55. Both trenches and cavity are filled with BLM materials to form the capture pad 52. Although trenches 54, which can serve as vias to the second to last level of metallization 56, are shown and described in the lower portion of the insulating layer 51, they can be replaced with a cavity in the lower portion, as shown in FIG. 12A and vias (not shown) can be formed away from the capture pad. After CMP (chemical/mechanical polish) of the surface of the insulating layer 51 and the capture pad 52, a passivation layer 57, herein layers 57A, 57B, 57C, and 57C, is deposited. Preferably, layer 57A is silicon nitride, layer 57B is silicon oxide, 57C is silicon nitride, and 57D is polyimide. A large via 58 is formed in the passivation layers and is aligned with and extends to the capture pad as shown in FIG. 11. In the present instance, the transfer process is used to transfer solder 59, preferably Pb-free solder, into the via 58 to the capture pad 52. The solder 59 is reflowed to yield the solder bump C4 structure 60 of FIG. 12.

Figure 13:
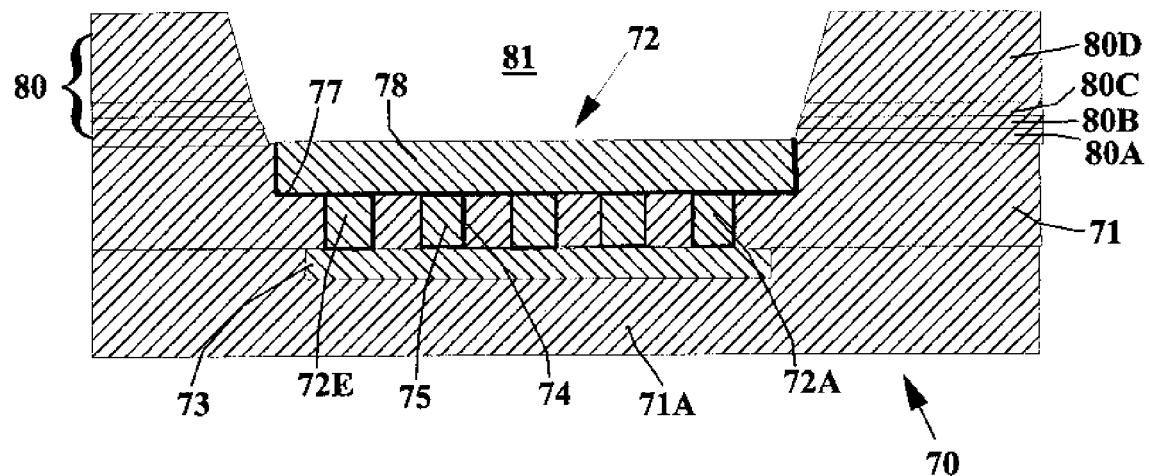
FIG. 13 is a cross-sectional view of a fourth embodiment of the present invention in which the capture pad is being formed in the chip and the trench structure is formed and filled with BLM materials, by a single damascene process, followed by depositing a liner after which the upper cavity is formed and filled with BLM materials, the trench structure serving as vias to the second to last level of metallization in the chip.
Figure 14:
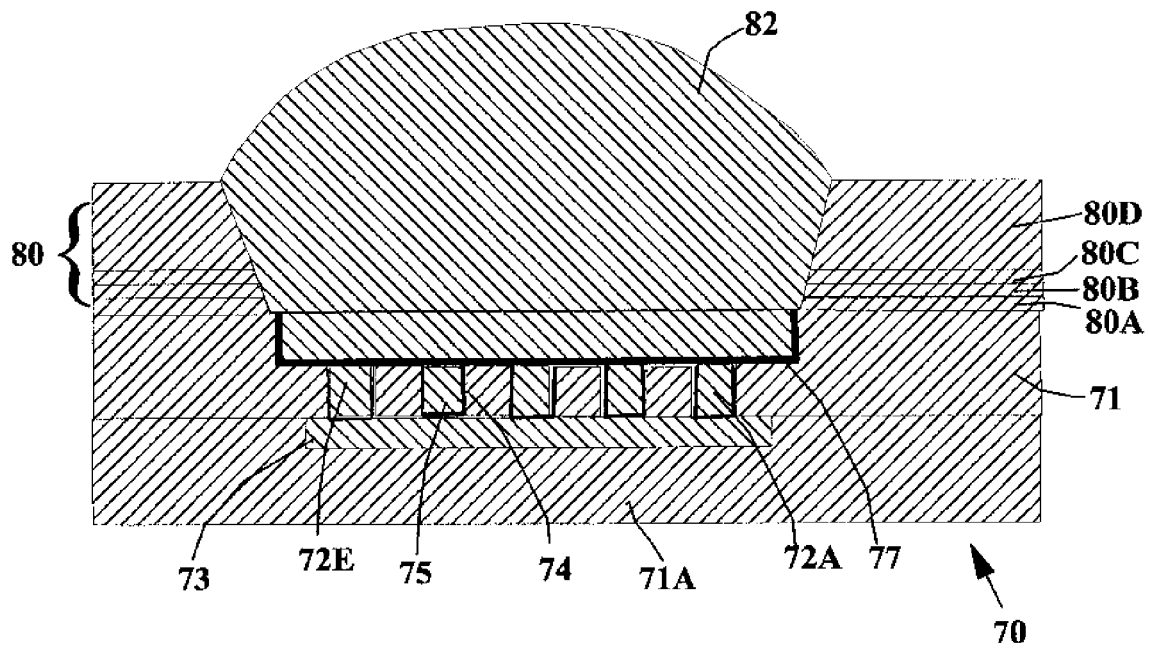
FIG. 14 is a cross-sectional view of the fourth embodiment of the present invention including the structure of FIG. 13 and showing, in addition, reflowed solder disposed in the via of FIG. 13.

Another embodiment of the present invention is shown in FIG. 13, which is a modification of the embodiment of FIGS. 12 and 13. The chip 70 comprises an upper insulation layer 71 in which a capture pad 72 will be formed. Similar to the embodiment of FIGS. 11 and 12, the capture pad 72 also serves the function of the final level of metallization, herein Cu, for the chip. In this capacity, the capture pad 72 is connected to the next level or layer 73 of metallization in a layer of insulation 71A. Using damascene process, the upper insulating layer 71 is herein anisotropically dry etched to form, in the layer, a cavity which, as shown in FIG. 13, comprises five trenches 76A . . . 76E. One or more of these trenches also serves as vias to the next level 73 of metallization. The walls of the trenches are lined with an adhesive layer 74, preferably TaN, and filled with a metal 75, preferably Ta and Cu. After filling the trenches, a second damascene process is used in which a cavity (not shown) is anisotropically dry etched in the upper insulating layer 71 above the trenches 76A . . . 76E. After being first lined with a BLM material 77 herein from top to bottom, 50 nm TaN, 150 nm TiW, and 400 nm Ti, the cavity is filled with Cu metal 78. Then, the surface of the Cu filled cavity 78 and adjacent insulating layer 71 are chemical/mechanical polished. In as much as the Cu filled cavity serves as the last metallization layer, the should be at least 0.5 microns thick and may as thick as 5 microns with the preferred thickness being 2 microns. A passivation layer 80 herein comprising, from bottom to top, of SiN 80A, $SiO_2$ 80B, SiN 80C, and polyimide 80D is deposited on the polished surface and formed with a large via 81 to the Cu filled cavity or capture pad 72. Similar to the embodiment of FIGS. 11 and 12, solder 82, preferably Pb-free solder, is deposited through the via 81 to the capture pad 72. A number of deposition techniques are available to deposit the solder 82, the transfer process described in the paper entitled "Low-cost wafer bumping" cited in the application is the preferred method of deposition. The solder 82 is reflowed to yield the solder bump 82 or C4 structure of FIG. 14.

As a modification of forming trenches in the lower portion passivation layer 33, a continuous cavity (not shown) is formed by anisotropic etching and filled with BLM metallization 90, including Cu, as shown in FIG. 10A. The vias to the final level of metallization in the chip are not part of the capture pad 37 but are formed away from the capture pad to connect to the last level of metallization (not shown). Similarly, the trenches of FIG. 12 are modified to form a continuous lower cavity (not shown) in the top insulating layer 51 of the chip by anisotropic etching and filled with BLM metallization 91, including Cu, as shown in FIG. 12A. Again, the vias to the second to last level of metallization in the chip are not part of the capture pad 55 with the solder bump 60 but are formed away from the capture pad to connect to the second to last level of metallization (not shown).

Although this invention has been described relative to specific embodiments for purposes of understanding, it will be realized that alterations and modifications may be made thereto without departing from the scope of the following claims. Therefore, the present embodiments are to be considered as illustrative and not restricted, and the invention is not to be limited to the details given herein, but may be modified within the scope and equivalents of the following claims.

What is claimed is:

1. In the manufacturing method of an integrated circuit chip in which the chip is physically and electrically connected to a substrate of a carrier package by area-array Pb-free solder bumps on the face of the chip, comprising the steps of:
   fabricating the circuitry including metallization within the chip;
   depositing an insulating layer of a thick layer and three thinner layers under the thick layer on the upper surface of the chip;
   using a dual damascene process, after depositing said insulating layer, to etch in the insulating layer a lower smaller cavity aligned with and extending to the metallization within the chip and an upper larger cavity for a capture pad;
   continue using the dual damascene process to fill the lower and upper cavities with ball limiting metallization to form a capture pad for a solder bump and a via to the metallization within the chip;
   depositing Pb-free solder on the capture pad; and
   reflowing the Pb-free solder to form a solder bump.

2. The method of claim 1 wherein said deposited insulating layer is a passivation layer and the capture pad is formed in the passivation layer and the via extends to the final level of metallization in the chip.

3. The method of claim 1 wherein said deposited insulating layer is the top layer of the chip and the capture pad is formed in the insulating layer and the via extends to the second to final level of metallization in the chip and serves as both a capture pad and the final level of metallization in the chip.

4. The method of claim 1 wherein the passivation layer is isotropically etched so that the thick layer is completely removed to create the cavity and the three thinner layers are only partially etched laterally to form trenches.

5. The method of claim 1 wherein the final metallization level comprises copper and the upper portion of the ball limiting metallization comprises copper.

6. The method of claim 1 wherein the passivation layer is about 1.5 microns thick.

7. The method of claim 1 wherein the solder is deposited by transferring an amount of solder the size of the capture pad to the capture pad.

8. The method of claim 1 wherein the upper surfaces of the insulating layer and the ball limiting metallization or capture pad are chemical/mechanical polished to planarize the two surfaces.

9. The method of claim 2 wherein the ball limiting metallization comprises about 50 nm of TaN, about 150 nm of TiW, about 400 nm of Ti, and about 500 nm of Cu, said Cu serving as a barrier to prevent the Pb-free solder metallization from reaching the chip.

10. The method of claim 2 wherein, after the capture pad is formed, an additional passivation layer is deposited on the insulating layer before the solder is transferred to the capture pad.

11. The method of claim 3 wherein the final metallization level and capture pad is formed before the deposition of the insulating layer.

12. In the manufacture method of an integrated circuit chip in which the chip is physically and electrically connected to a substrate of a carrier package by area-array solder bumps on the face of the chip, comprising the steps of:
   fabricating the circuitry within the chip with a final metallization level or capture pad formed within an insulation layer of a thick layer and three thinner layers under the thick layer at the top or face of the chip;
   depositing a passivation layer on the insulation layer and the final metallization level or capture pad;
   using a dual damascene process to isotropically etch in the passivation layer cavities aligned with and extending to the final metallization level or capture pad;
   depositing solder on the capture pad and in direct physical contact with the sidewalls of the passivation layer; and
   reflowing the solder to form a solder bump.

13. Integrated circuit chip in which the chip is physically and electrically connected to a substrate of a carrier package by area-array solder bumps on the face of the chip, comprising:
   an integrated circuit chip including metallization within the chip;
   an insulating layer of a thick layer and three thinner layers under the thick layer at the upper portion of the chip;
   a capture pad including ball limiting metallization for a Pb-free solder bump disposed in the insulating layer and connected directly to a metallization layer in the chip, said ball limiting metallization including a thick upper Cu layer sufficient to serve as a diffusion barrier for said Pb-free solder into said chip; and
   a Pb-free solder bump disposed on the capture pad.

14. The integrated circuit chip of claim 13 wherein the insulating layer is a passivation layer and the capture pad is disposed in the passivation layer.

15. The integrated circuit chip of claim 13 wherein the insulating layer is the last insulation layer of the chip and the capture pad is disposed in the insulation layer and serves the dual functions of capture pad and final level of metallization of the chip.

16. The integrated circuit chip of claim 15 wherein the capture pad contains at least one via and the via is connected to the second to last level of metallization.

17. The integrated circuit chip of claim 13 wherein the insulating layer is the passivation layer on top of the chip.

18. The integrated circuit chip of claim 15 wherein the capture pad is in the last insulating layer of the chip and the solder bump is in direct physical contact with the sidewalls of the passivation layer.

19. The integrated circuit chip of claim 17 wherein the solder bump is in direct physical contact with the sidewalls of the passivation layer.

20. The integrated circuit chip of claim 13 wherein said ball limiting metallization includes a thick upper Cu layer within the range of at least 0.5 microns and 5 microns thick and is sufficient to serve as a diffusion barrier for said Pb-free solder into said chip.

* * * * *

UNITED STATES PATENT AND TRADEMARK OFFICE
CERTIFICATE OF CORRECTION

PATENT NO. : 7,635,643 B2
APPLICATION NO. : 11/380215
DATED : December 22, 2009
INVENTOR(S) : Daubenspeck et al.

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 302 days.

Signed and Sealed this

Ninth Day of November, 2010

David J. Kappos
*Director of the United States Patent and Trademark Office*